(12) United States Patent
Lee et al.

(10) Patent No.: US 8,878,349 B2
(45) Date of Patent: Nov. 4, 2014

(54) SEMICONDUCTOR CHIP AND STACKED SEMICONDUCTOR PACKAGE HAVING THE SAME

(75) Inventors: Gyu Jei Lee, Seoul (KR); Kang Won Lee, Icheon-si (KR); Hyun Joo Kim, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 118 days.

(21) Appl. No.: 13/586,309

(22) Filed: Aug. 15, 2012

(65) Prior Publication Data
US 2013/0241078 A1    Sep. 19, 2013

(30) Foreign Application Priority Data

Mar. 15, 2012  (KR) .......................... 10-2012-0026494

(51) Int. Cl.
*H01L 23/20*    (2006.01)
(52) U.S. Cl.
USPC ............................. 257/682; 257/758; 438/476
(58) Field of Classification Search
USPC .......... 257/682, 758, 774; 438/143, 310, 402, 438/476, FOR. 146
See application file for complete search history.

(56) References Cited

U.S. PATENT DOCUMENTS

| | | | |
|---|---|---|---|
| 6,121,097 A * | 9/2000 | Urano et al. | 438/294 |
| 6,139,905 A * | 10/2000 | Chen et al. | 427/124 |
| 6,297,147 B1 * | 10/2001 | Yang et al. | 438/627 |
| 6,790,775 B2 * | 9/2004 | Fartash | 438/667 |
| 7,329,897 B2 * | 2/2008 | Nishikawa et al. | 257/40 |
| 7,943,514 B2 | 5/2011 | West | |
| 8,053,761 B2 * | 11/2011 | Hahn et al. | 257/40 |
| 2002/0070421 A1 * | 6/2002 | Ashburn et al. | 257/510 |
| 2006/0194409 A1 * | 8/2006 | Capedelli et al. | 438/424 |
| 2009/0212438 A1 | 8/2009 | Kreupl | |

* cited by examiner

*Primary Examiner* — S. V. Clark
(74) *Attorney, Agent, or Firm* — William Park & Associates Patent Ltd.

(57) ABSTRACT

A semiconductor chip includes a semiconductor substrate having one surface, an other surface which faces away from the one surface, and through holes which pass through the one surface and the other surface; through electrodes filled in the through holes; and a gettering layer formed of polysilicon interposed between the through electrodes and inner surfaces of the semiconductor substrate whose form is defined by the through holes.

19 Claims, 7 Drawing Sheets

SEMICONDUCTOR CHIP AND STACKED SEMICONDUCTOR PACKAGE HAVING THE SAME

CROSS-REFERENCE TO RELATED APPLICATIONS

The present application claims priority to Korean patent application number 10-2012-26494 filed on Mar. 15, 2012, in the Korean Intellectual Property Office which is incorporated herein by reference in its entirety.

BACKGROUND OF THE INVENTION

1. Field of the Invention

The present invention relates to a semiconductor chip which has through electrodes and a stacked semiconductor package having the same.

2. Description of the Related Art

In the semiconductor industry, packaging technologies for integrated circuits have continuously been developed to satisfy the demand toward miniaturization and mounting reliability. Recently, as miniaturization and high performance have progressed in electric and electronic appliances, various stacking techniques have been developed.

The term "stack" that is referred to in the semiconductor industry means to vertically pile at least two semiconductor chips or semiconductor packages. In the case of a memory device, by using a stacking technology, it is possible to realize a product having memory capacity at least two times greater than that obtainable through semiconductor integration processes. Since stacked semiconductor packages have advantages in terms of not only memory capacity but also mounting density and mounting area utilization efficiency, research and development for stacked semiconductor packages has been accelerated.

As an example of a stacked semiconductor package, a structure has been proposed, in which through electrodes are formed in semiconductor chips so that upper and lower semiconductor chips are physically and electrically connected with one another by the through electrodes.

However, a substance used as the through electrodes, for example, copper, is likely to diffuse in a semiconductor chip to cause a crystal defect. As a consequence, leakage current may be induced in the semiconductor chip, and the threshold voltage of a transistor is likely to be shifted, by which a refresh characteristic may deteriorate.

In order to cope with this problem, a method has been disclosed, in which the thickness of a dielectric layer ($SiO_2$) formed between a through electrode and a semiconductor chip is increased so that copper diffusing toward the semiconductor chip can be gettered by the dielectric layer. Nevertheless, the dielectric layer is not sufficient to getter the copper diffusing from the through electrode.

BRIEF SUMMARY OF THE INVENTION

An embodiment of the present invention is directed to a semiconductor chip which has an improved gettering characteristic.

Also, an embodiment of the present invention is directed to a stacked semiconductor package having the semiconductor chip.

In one embodiment of the present invention, a semiconductor chip includes: a semiconductor substrate having one surface, an other surface which faces away from the one surface, and through holes which pass through the one surface and the other surface; through electrodes filled in the through holes; and a a gettering layer formed of polysilicon interposed between the through electrodes and inner surfaces of the semiconductor substrate whose form is defined by the through holes.

The gettering layer may be formed between entire inner surfaces of the semiconductor substrate whose form is defined by the through holes, and the through electrodes. In this case, the semiconductor chip may further include: a dielectric layer formed between the gettering layer and the through electrodes; and an adhesive layer formed between the dielectric layer and the through electrodes.

The semiconductor substrate may further include an integrated circuit which is formed from the one surface of the semiconductor substrate to a partial thickness of the semiconductor substrate, and the gettering layer may be formed between portions of the inner surfaces of the semiconductor substrate whose form is defined by the through holes where the integrated circuit is disposed, and the through electrodes. In this case, the semiconductor chip may further include: a dielectric layer formed between the gettering layer and the through electrodes and between the semiconductor substrate and the through electrodes; and an adhesive layer formed between the dielectric layer and the through electrodes.

The semiconductor chip may further include a circuit pattern formed over the one surface of the semiconductor substrate, and including wiring layers and a dielectric layer which isolates the semiconductor substrate and the wiring layers from each other and isolates the wiring layers from one another, and the through electrodes may pass through the circuit pattern.

The gettering layer may extend to between the circuit pattern and the through electrodes such that the gettering layer is interposed between the circuit pattern and the through electrodes.

The semiconductor chip may further include a circuit pattern formed over the one surface of the semiconductor substrate and the through electrodes, and the circuit pattern may include: bonding pads formed over a second surface of the circuit pattern facing away from a first surface of the circuit pattern which faces the semiconductor substrate; wiring layers electrically connecting the through electrodes and the bonding pads with each other; and a dielectric layer isolating the semiconductor substrate and the through electrodes from the wiring layers, the wiring layers from one another, and the wiring layers and the bonding pads from each other.

In another embodiment of the present invention, a semiconductor package includes: a plurality of semiconductor chips each including a semiconductor substrate having one surface, an other surface which faces away from the one surface, and through holes which pass through the one surface and the other surface, through electrodes filled in the through holes, and a gettering layer formed of polysilicon interposed between the through electrodes and inner surfaces of the semiconductor substrate whose form is defined by the through holes, the plurality of semiconductor chips being stacked such that their through electrodes are electrically connected with one another; and conductive connection members is electrically connecting the through electrodes of the stacked semiconductor chips.

The gettering layer of each semiconductor chip may be formed between entire inner surface of the semiconductor substrate whose form is defined by the through holes, and the through electrodes. In this case, each semiconductor chip may further include: a dielectric layer formed between the gettering layer and the through electrodes; and an adhesive layer formed between the dielectric layer and the through electrodes.

The semiconductor substrate of each semiconductor chip may further has an integrated circuit which is formed from the one surface of the semiconductor substrate to a partial thickness of the semiconductor substrate, and the gettering layer may be formed between portions of the inner surfaces of the semiconductor substrate whose form is defined by the through holes where the integrated circuit is disposed, and the through electrodes. In this case, each semiconductor chip may further include: a dielectric layer formed between the gettering layer and the through electrodes and between the semiconductor substrate and the through electrodes; and an adhesive layer formed between the dielectric layer and the through electrodes.

Each semiconductor chip may further include: a circuit pattern formed over the one surface of the semiconductor substrate, and including wiring layers and a dielectric layer which isolates the is semiconductor substrate and the wiring layers from each other and the wiring layers from one another, and the through electrodes may pass through the circuit pattern. The gettering layer of each semiconductor chip may extend to between the circuit pattern and the through electrodes such that the gettering layer is interposed between the circuit pattern and the through electrodes.

Each semiconductor chip may further include a circuit pattern formed over the one surface of the semiconductor substrate and the through electrodes, and the circuit pattern may include: bonding pads formed over a second surface of the circuit pattern facing away from a first surface of the circuit pattern which faces the semiconductor substrate; wiring layers electrically connecting the through electrodes and the bonding pads with each other; and a dielectric layer isolating the semiconductor substrate and the through electrodes from the wiring layers, the wiring layers from one another, and the wiring layers and the bonding pads from each other.

The semiconductor package may further include: a first dielectric layer formed under a lower surface of a lowermost semiconductor chip among the stacked semiconductor chips in such a way as to leave exposed the through electrodes of the lowermost semiconductor chip; redistribution lines formed under the first dielectric layer and electrically connected with the through electrodes exposed through the first dielectric layer; and a second dielectric layer formed under the first dielectric layer including the redistribution lines in such a way as to leave exposed portions of the redistribution lines.

The semiconductor package may further include a structural body supporting the semiconductor chips and having connection electrodes which are electrically connected with the through electrodes of the lowermost semiconductor chip among the stacked semiconductor chips. The structural body may include any one of a printed circuit board, an interposer and a semiconductor package.

According to the embodiments of the present invention, due to the presence of a gettering layer which is formed between a semiconductor substrate and a through electrode and is made of a polysilicon layer, a metal diffusing from the through electrode toward the semiconductor substrate may be effectively gettered. In addition, since not only the metal diffusing from the through electrode toward the semiconductor substrate but also a metal causing a crystal defect in the semiconductor substrate are gettered, a gettering characteristic may be improved.

DESCRIPTION OF SPECIFIC EMBODIMENTS

Hereafter, specific embodiments of the present invention will be described in detail with reference to the accompanying drawings.

It is to be understood herein that the drawings are not necessarily to scale and in some instances proportions may have been exaggerated in order to more clearly depict certain features of the invention.

Figure 1:
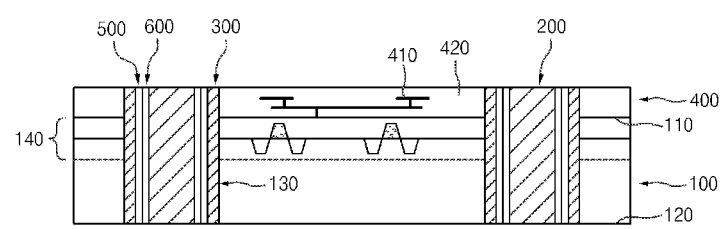
FIG. 1 is a cross-sectional view illustrating a semiconductor chip in accordance with an embodiment of the present invention.

FIG. 1 is a cross-sectional view illustrating a semiconductor chip in accordance with an embodiment of the present invention.

Referring to FIG. 1, a semiconductor chip 10A in accordance with an embodiment of the present invention includes a semiconductor substrate 100, through electrodes 200, and a gettering layer 300. Besides, the semiconductor chip 10A may further include a circuit pattern 400, a dielectric layer 500, and an adhesive layer 600.

The semiconductor substrate 100 includes one surface 110, an other surface 120, through holes 130, and an integrated circuit 140.

The one surface 110 faces away from the other surface 120, and the through holes 130 may pass through the one surface 110 and the other surface 120. The integrated circuit 140 is formed from the one surface 110 of the semiconductor substrate 100 to a partial thickness of the semiconductor substrate 100, and includes devices such as transistors, capacitors and resistors for storing and processing data.

The through electrodes 200 are filled in the through holes 130. A substance used as the through electrodes 200 may include at least any one material selected from the group consisting of copper, aluminum, an aluminum alloy, tin-silver (SnAg) and Gold (Au).

The circuit pattern 400 is formed on the one surface 110 of the semiconductor substrate 100, and the through electrodes 200 may pass through the circuit pattern 400.

In the present embodiment, the circuit pattern 400 includes wiring layers 410 and a dielectric layer 420. The wiring layers 410 are electrically connected with the integrated circuit 140, and the dielectric layer 420 isolates the semiconductor substrate 100 and the wiring layers 410 from each other, and the dielectric layer 420 isolates the wiring layers 410 from one another.

The gettering layer 300 includes polysilicon, and is formed between entire inner surfaces of the semiconductor substrate 100 whose form is defined by the through holes 130, and the through electrodes 200. In the present embodiment, the gettering layer 300 also extends to regions between the circuit pattern 400 and the through electrodes 200, and is thus formed between the circuit pattern 400 and the through electrodes 200.

Although it was illustrated and explained in the present embodiment that the gettering layer 300 is formed not only between the semiconductor substrate 100 and the through electrodes 200 but also between the circuit pattern 400 and the through electrodes 200, it is to be noted that in some variations of the present embodiment the gettering layer 300 may be formed between the semiconductor substrate 100 and the through electrodes 200 and there may be no gettering layer 300 between the circuit pattern 400 and the through electrodes 200.

The dielectric layer 500 is formed between the gettering layer 300 and the through electrodes 200. The dielectric layer 500 may include at least any one material selected from the group consisting of an oxide layer, a nitride layer and an organic layer.

The adhesive layer 600 is formed between the dielectric layer 500 and the through electrodes 200, and may include at least any one material selected from the group consisting of titanium (Ti), a titanium nitride (TiN), a tantalum nitride (TaN), Ti/TiN, Ta/TaN and Titanium-Tungsten (TiW).

Although the embodiment described above with reference to FIG. 1 shows the case in which the gettering layer 300 is formed between the entire inner surfaces of the semiconductor substrate 100 whose form is defined by the through holes 130, and the through electrodes 200, it is to be noted that other variations the gettering layer 300 may be formed only between portions of the inner surfaces of the semiconductor substrate 100 where the integrated circuit 140 is disposed and the through electrodes 200. This type of a semiconductor chip will be described below with reference to FIG. 2.

Figure 2:
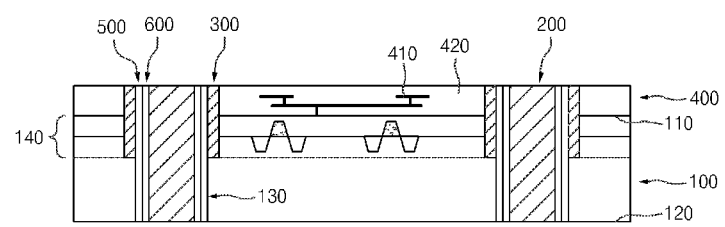
FIG. 2 is a cross-sectional view illustrating a is semiconductor chip in accordance with an embodiment of the present invention.

FIG. 2 is a cross-sectional view illustrating a semiconductor chip in accordance with an embodiment of the present invention.

Referring to FIG. 2, a semiconductor chip 10B in accordance with an embodiment of the present invention includes a semiconductor substrate 100, through electrodes 200, and a gettering layer 300. Besides, the semiconductor chip 10B may further include a circuit pattern 400, a dielectric layer 500, and an adhesive layer 600.

The semiconductor substrate 100 includes one surface 110, an other surface 120, through holes 130, and an integrated circuit 140.

The one surface 110 faces away from the other surface 120, and the through holes 130 pass through the one surface 110 and the other surface 120. The integrated circuit 140 is formed from the one surface 110 of the semiconductor substrate 100 to a partial thickness of the semiconductor substrate 100. The integrated circuit 140 includes devices such as transistors, capacitors and resistors for storing and processing data.

The through electrodes 200 are filled in the through holes 130. A substance used as the through electrodes 200 may include is at least any one material selected from the group consisting of copper, aluminum, an aluminum alloy, SnAg and Au.

The circuit pattern 400 is formed on the one surface 110 of the semiconductor substrate 100, and the through electrodes 200 pass through the circuit pattern 400.

In the present embodiment, the circuit pattern 400 includes wiring layers 410 and a dielectric layer 420. The wiring layers 410 are electrically connected with the integrated circuit 140, and the dielectric layer 420 isolates the semiconductor substrate 100 and the wiring layers 410 from each other, and the dielectric layer may isolate the wiring layers 410 from one another.

The gettering layer 300 includes polysilicon, and is formed between portions of the inner surfaces of the semiconductor substrate 100 whose form is defined by the through holes 130 where the integrated circuit 140 is disposed, and the through-silicon vias 200. In other words, the gettering layer 300 is present at depths at which the integrated circuit 140 is disposed. In the present embodiment, the gettering layer 300 extends to regions between the circuit pattern 400 and the through electrodes 200, and thus the gettering layer 300 may be formed between the circuit pattern 400 and the through electrodes 200.

Although it was illustrated and explained in the present embodiment that the gettering layer 300 is formed not only between the semiconductor substrate 100 and the through electrodes 200 but also between the circuit pattern 400 and the through electrodes 200, it is to be noted that in some variations of this embodiment, the gettering layer 300 may be formed between the semiconductor substrate 100 and the through electrodes 200 and it may be that there is no gettering layer 300 formed between the circuit pattern 400 and the through electrodes 200.

The dielectric layer 500 is formed between the gettering layer 300 and the through electrodes 200, and the dielectric layer 500 may be formed between the semiconductor substrate 100 and the through electrodes 200. The dielectric layer 500 may include at least any one material selected from the group consisting of an oxide layer, a nitride layer and an organic layer. The adhesive layer 600 is formed between the dielectric layer 500 and the through electrodes 200, and may include at least any one material selected from the group consisting of titanium (Ti), a titanium nitride (TiN), a tantalum nitride (TaN), Ti/TiN, Ta/TaN and TiW.

Although the embodiments described above with reference to FIGS. 1 and 2 show the case in which the through electrodes 200 pass through the circuit pattern 400, it is to be noted that in other embodiments it may be that the through electrodes 200 do not pass through the circuit pattern 400. These types of semiconductor chips will be described below with reference to FIGS. 3 and 4.

Figure 3:
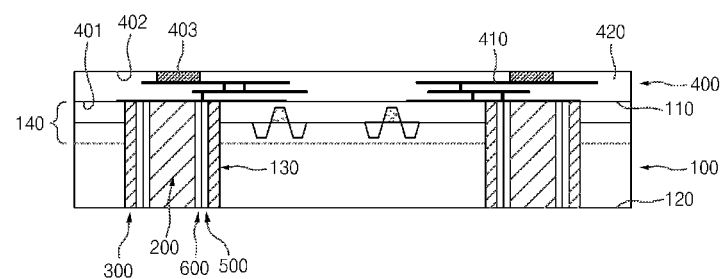
FIG. 3 is a cross-sectional view illustrating a semiconductor chip in accordance with an embodiment of the present invention.

FIG. 3 is a cross-sectional view illustrating a semiconductor chip in accordance with an embodiment of the is present invention.

Referring to FIG. 3, a semiconductor chip 10C in accordance with a an embodiment of the present invention includes a semiconductor substrate 100, through electrodes 200, and a gettering layer 300. Besides, the semiconductor chip 10C may further include a circuit pattern 400, a dielectric layer 500, and an adhesive layer 600.

The semiconductor substrate 100 includes one surface 110, an other surface 120, through holes 130, and an integrated circuit 140.

The one surface 110 faces away from the other surface 120, and the through holes 130 may pass through the one surface 110 and the other surface 120. The integrated circuit 140 is formed from the one surface 110 of the semiconductor substrate 100 to a partial thickness of the semiconductor substrate 100, and the integrated circuit 140 may include devices such as transistors, capacitors and resistors for storing and processing data.

The through electrodes 200 are filled in the through holes 130. A substance used as the through electrodes 200 may include at least any one material selected from the group consisting of copper, aluminum, an aluminum alloy, SnAg and Au.

The circuit pattern 400 is formed on the one surface 110 of the semiconductor substrate 100 and the through electrodes 200, and includes the circuit pattern 400 includes a first surface 401, a second surface 402, bonding pads 403, wiring layers 410 and a dielectric layer 420.

The first surface 401 of the circuit pattern 400 faces the one surface 110 of the semiconductor substrate 100, and the second surface 402 faces away from the first surface 401. The bonding pads 403 are formed on the second surface 402 of the circuit pattern 400. While not shown in detail, the wiring layers 410 electrically connect the through electrodes 200 and the bonding pads 403 with each other. The wiring layers 410 electrically connect the bonding pads 403 and the integrated circuit 140 with each other. The dielectric layer 420 electrically isolates the semiconductor substrate 100 and the through electrodes 100 and 200 and the wiring layers 410 from each other. The dielectric layer 420 may also electrically isolate the wiring layers 410 from one another. Further, the dielectric layer 420 may also electrically isolate the wiring layers 410 and the bonding pads 403 from each other.

The gettering layer 300 includes polysilicon, and is formed between entire inner surfaces of the semiconductor substrate 100 whose form is defined by the through holes 130, and the through electrodes 200.

The dielectric layer 500 is formed between the gettering layer 300 and the through electrodes 200. The dielectric layer 500 may include at least any one material selected from the group consisting of an oxide layer, a nitride layer and an organic layer. The adhesive layer 600 is formed between the dielectric layer 500 and the through electrodes 200, and may include at least any one material selected from the group consisting of titanium (Ti), a titanium nitride (TiN), a tantalum nitride (TaN), Ti/TiN, Ta/TaN and TiW.

Figure 4:
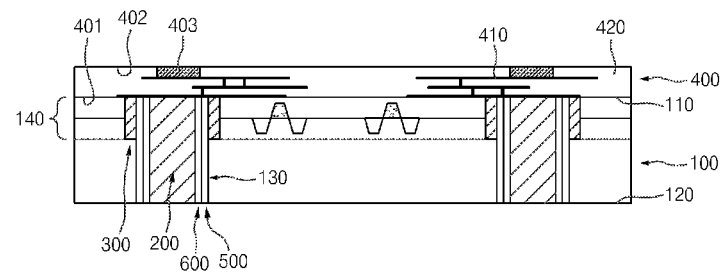
FIG. 4 is a cross-sectional view illustrating a semiconductor chip in accordance with an embodiment of the present invention.

FIG. 4 is a cross-sectional view illustrating a semiconductor chip in accordance with an embodiment of the present invention.

Referring to FIG. 4, a semiconductor chip 10D in accordance with a an embodiment of the present invention includes a semiconductor substrate 100, through electrodes 200, and a gettering layer 300. Besides, the semiconductor chip 10D may further include a circuit pattern 400, a dielectric layer 500, and an adhesive layer 600.

The semiconductor substrate 100 includes one surface 110, an other surface 120, through holes 130, and an integrated circuit 140.

The one surface 110 faces away from the other surface 120, and the through holes 130 that may pass through the one surface 110 and the other surface 120. The integrated circuit 140 is formed from the one surface 110 of the semiconductor substrate 100 to a partial thickness of the semiconductor substrate 100, and the integrated circuit 140 may include devices such as transistors, capacitors and resistors for storing and processing data.

The through electrodes 200 are filled in the through holes 130. A substance used as the through electrodes 200 may include at least any one material selected from the group consisting of copper, aluminum, an aluminum alloy, SnAg and Au.

The circuit pattern 400 is formed on the one surface 110 of the semiconductor substrate 100 and may cover the through electrodes 200. The circuit pattern 400 may include a first surface 401, a second surface 402, bonding pads 403, wiring layers 410 and a dielectric layer 420.

The first surface 401 faces one surface 110 of the semiconductor substrate 100, and the second surface 402 faces away from the first surface 401. The bonding pads 403 are formed on the second surface 402. While not shown in detail, the wiring layers 410 may electrically connect the through electrodes 200 and the bonding pads 403 with each other. The wiring layers 410 may also electrically connect the bonding pads 403 and the integrated circuit 140 with each other. The dielectric layer 420 may electrically isolate the semiconductor substrate and the through electrodes 100 and 200. The dielectric layer 420 may also electrically isolate the wiring layers 410 from each other. Further, the dielectric layer 420 may electrically isolate the wiring layers 410 and the bonding pads 403 from each other.

The gettering layer 300 includes polysilicon, and is formed between portions of the inner surfaces of the semiconductor substrate 100 whose form is defined by the through holes 130 where the integrated circuit 140 is disposed, and the through electrodes 200. In other words, the gettering layer 300 is present at depths at which the integrated circuit 140 is disposed.

The dielectric layer 500 is formed between the gettering layer 300 and the through electrodes 200, and the dielectric layer 500 may be formed between the semiconductor substrate 100 and the through electrodes 200. The dielectric layer 500 may include at least any one material selected from the group consisting of an oxide layer, a nitride layer and an organic layer. The adhesive layer 600 is formed between the dielectric layer 500 and the through electrodes 200, and may include at least any one material selected from the group consisting of titanium (Ti), a titanium nitride (TiN), a tantalum nitride (TaN), Ti/TiN, Ta/TaN and TiW.

While not shown in a drawing, the gettering layer 300 may be formed of a material other than a polysilicon. Instead, the gettering layer 300 may be formed by doping boron into the inner surfaces of the semiconductor substrate 100, which are formed due to defining of the through holes 130.

Hereinbelow, stacked semiconductor packages having the above-described semiconductor chip will be described.

Figure 5:
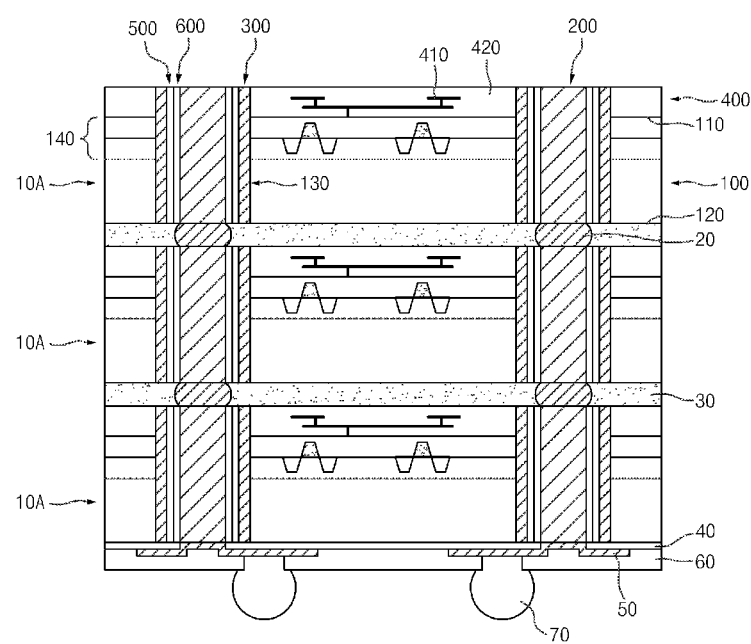
FIG. 5 is a cross-sectional view illustrating a stacked semiconductor package in accordance with an embodiment of the present invention.

FIG. 5 is a cross-sectional view illustrating a stacked semiconductor package in accordance with an embodiment of the present invention.

Referring to FIG. 5, after preparing a plurality of semiconductor chips 10A each having through electrodes 200 and a gettering layer 300, the plurality of semiconductor chips 10A are vertically stacked such that their through electrodes 200 are electrically connected with one another. Conductive connection members 20 are formed between the through electrodes 200 of the stacked semiconductor chips 10A to electrically connect the through electrodes 200 of upper and lower semiconductor chips 10A, and adhesive members 30 are formed between the stacked semiconductor chips 10A to attach upper and lower semiconductor chips 10A to each other.

The conductive connection members 20 may be formed of a metal including at least one of copper, tin and silver, and the adhesive members 30 may include any one of a non-conductive film (NCF), a non-conductive paste (NCP), an anisotropic conductive film (ACF), an anisotropic conductive paste (ACP) and a polymer.

A first dielectric layer 40 is formed on a lower surface of a lowermost semiconductor chip 10A among the stacked semiconductor chips 10A in such a way as to leave exposed the through electrodes 200 of the lowermost semiconductor chip 10A, and redistribution lines 50 are formed on the first dielectric layer 40 to be electrically connected with the through electrodes 200 exposed through the first dielectric layer. A second dielectric layer 60 is formed underneath and substantially in contact with the first dielectric layer 40 including the redistribution lines 50 in such a way as to leave exposed portions of the redistribution lines 50. External connection terminals 70 may be mounted to the portions of the redistribution lines 50 which remain exposed through the second dielectric layer 60.

Figure 6:
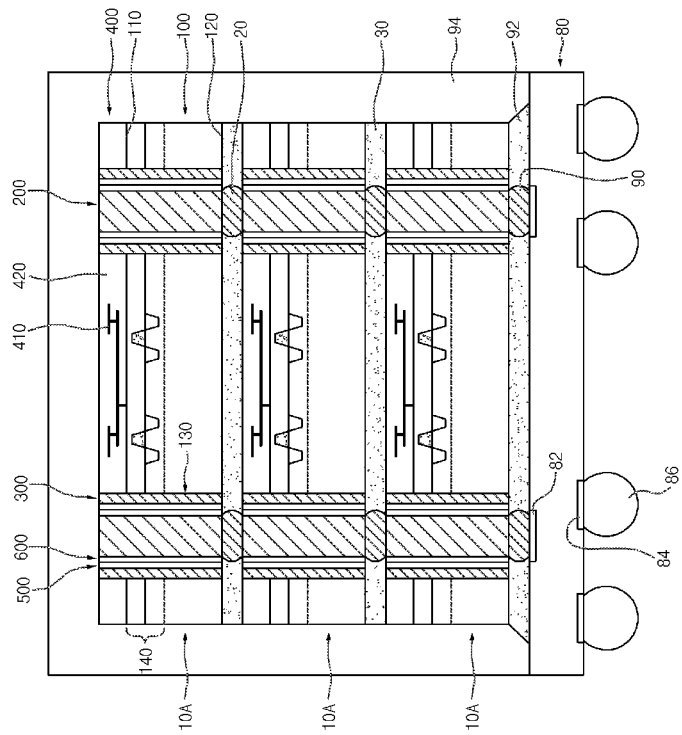
FIG. 6 is a cross-sectional view illustrating a stacked semiconductor package in accordance with an embodiment of the present invention.

FIG. 6 is a cross-sectional view illustrating a stacked semiconductor package in accordance with an embodiment of the present invention.

Referring to FIG. 6, after preparing a plurality of semiconductor chips 10A each having through electrodes 200 and a gettering layer 300, the plurality of semiconductor chips 10A are vertically stacked such that their through electrodes 200 are electrically connected with one another. Conductive connection members 20 are formed between the through electrodes 200 of the stacked semiconductor chips 10A to electrically connect the through electrodes 200 of upper and lower semiconductor chips 10A, and adhesive members 30 are formed between the stacked semiconductor chips 10A to attach upper and lower semiconductor chips 10A to each other.

The conductive connection members 20 may include a metal including at least one of copper, tin and silver, and the adhesive members 30 may include any one of a non-conductive film (NCF), a non-conductive paste (NCP), an anisotropic conductive film (ACF), an anisotropic conductive paste (ACP) and a polymer.

The semiconductor chips 10A may be mounted to a structural body 80 such that the through electrodes 200 of a lowermost semiconductor chip 10A among the stacked semiconductor chips 10A is electrically connected with connection electrodes 82 of the structural body 80. In the present embodiment, the structural body 80 includes a printed circuit board (PCB).

The through electrodes 200 of the lowermost semiconductor chip 10A and the connection electrodes 82 of the structural body 80 are electrically connected with each other by conductive connection members 90. An adhesive member 92 is formed between the lowermost semiconductor chip 10A and the structural body 80 to attach the lowermost semiconductor chip 10A and the structural body 80 to each other.

The conductive connection members 90 may be formed of a metal including at least one of copper, tin and silver, and the adhesive member 92 may include any one of a non-conductive film (NCF), a non-conductive paste (NCP), an anisotropic conductive film (ACF), an anisotropic conductive paste (ACP) and a polymer.

The upper surface of the structural body 80 including the stacked semiconductor chips 10A is molded by a molding member 94. The reference numeral 84 designates ball lands, and the reference numeral 86 designates solder balls used as external connection terminals.

While it was described in the embodiment shown in FIG. 6 that the structural body 80 includes a printed circuit board, it is to be noted that the structural body 80 may include a semiconductor package or an interposer.

Figure 7:
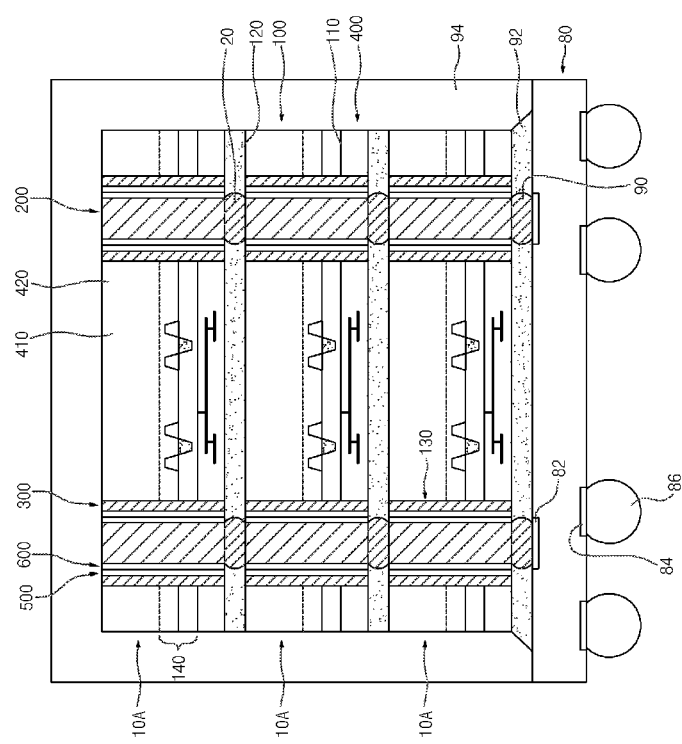
FIG. 7 is a cross-sectional view illustrating a stacked semiconductor package in accordance with an embodiment of the present invention.

FIG. 7 is a cross-sectional view illustrating a stacked semiconductor package in accordance with an embodiment of the present invention.

Unlike the stacked semiconductor package in accordance with the embodiment of the present invention described just above with reference to FIG. 6, the stacked semiconductor package in accordance with an embodiment of the present invention includes a construction that semiconductor chips 10A are stacked in a face-down manner on a structural body 80. Accordingly, the stacked semiconductor package in accordance with the instant embodiment of the present invention has the same construction as the stacked semiconductor package in accordance with the embodiment of the present invention described with reference to FIG. 6 except the stack type of the semiconductor chips 10A. Therefore, repeated descriptions for the same component elements will be omitted herein.

While it was described in the embodiments of FIGS. 5 to 7 that a stacked semiconductor package is constructed by stacking the semiconductor chip 10A shown in FIG. 1 in a plural number, it is to be noted that the present invention is not limited to such, and a stacked semiconductor package may be constructed by stacking in a plural number any one of the semiconductor chips 10B, 10C and 10D shown in FIGS. 2 to 4 instead of the semiconductor chip 10A shown in FIG. 1 or a stacked semiconductor package may be constructed by at least two kinds of semiconductor chips among the semiconductor chips 10A, 10B, 10C and 10D shown in FIGS. 1 to 4.

The aforementioned semiconductor chips may be applied to various electronic apparatuses.

Figure 8:
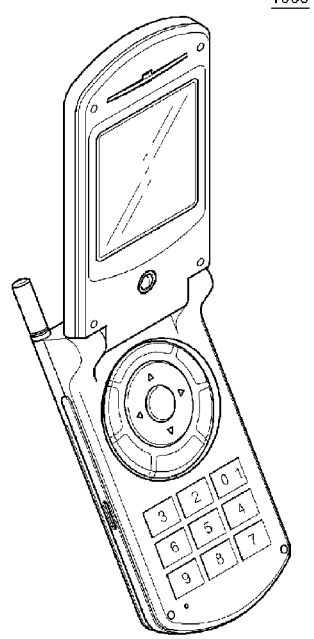
FIG. 8 is a perspective view illustrating an electronic apparatus having the semiconductor chip according to the present to invention.

FIG. 8 is a perspective view illustrating an electronic apparatus having the semiconductor chip according to the present invention.

Referring to FIG. 8, the semiconductor chip according to the embodiments of the present invention may be applied to an electronic apparatus 1000 such as a portable phone. Since the semiconductor chip according to the embodiments of the present invention has an excellent gettering characteristic, advantages are provided for improving the performance of the electronic apparatus 1000. The electronic apparatus 1000 is not limited to the portable phone shown in FIG. 8, and may include various electronic appliances, for example, such as a mobile electronic appliance, a laptop computer, a notebook computer, a portable multimedia player (PMP), an MP3 player, a camcorder, a web tablet, a wireless phone, a navigator, a personal digital assistant (PDA), and other types of semiconductor devices.

Figure 9:
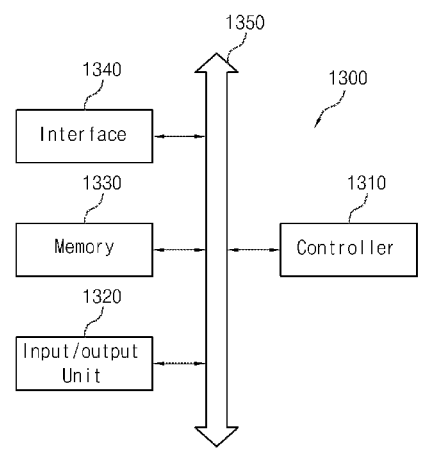
FIG. 9 is a block diagram showing an example of the electronic apparatus having the semiconductor chip according to the present invention.

FIG. 9 is a block diagram showing an example of the electronic apparatus having the semiconductor chip according to the present invention.

Referring to FIG. 9, an electronic system 1300 may include a controller 1310, an input/output unit 1320, and a memory 1330. The controller 1310, the input/output unit 1320 and the memory 1330 may be coupled with one another through a bus 1350. The bus 1350 serves as a path through which data move. For example, the controller 1310 may include at least any one of at least one microprocessor, at least one digital signal processor, at least one microcontroller, and logic devices capable of performing the same functions as these components. The controller 1310 and the memory 1330 may include the semiconductor chip according to the present invention. The input/output unit 1320 may include at least one selected among a keypad, a keyboard, a display device, and so forth. The memory 1330 is a device for storing data. The memory 1330 may store data and/or commands to be executed by the controller 1310, and the like. The memory 1330 may include a volatile memory device and/or a nonvolatile memory device. Otherwise, the memory 1330 may be constituted by a flash memory. For example, a flash memory to which the technology of the present invention is applied may be mounted to an information processing system such as a mobile terminal or a desktop computer. The flash memory may be constituted by a solid state drive (SSD). In this case, the electronic system 1300 may stably store a large amount of data in a flash memory system. The electronic system 1300 may further include an interface 1340 configured to transmit and receive data to and from a communication network. The interface 1340 may be a wired or wireless type. For example, the interface 1340 may include an antenna or a wired or wireless transceiver. Further, while not shown, a person skilled in the art will readily appreciate that the electronic system 1300 may be additionally provided with an application chipset, a camera image processor (CIS), an input/output unit, etc.

As is apparent from the above description, according to the present invention, due to the presence of a gettering layer which is formed between a semiconductor substrate and a through electrode and is made of a polysilicon layer, a metal diffusing from the through electrode toward the semiconductor substrate may be effectively gettered. In addition, since not only the metal diffusing from the through electrode toward the semiconductor substrate but also a metal causing a crystal defect in the semiconductor substrate are gettered, a gettering characteristic may be improved.

Although specific embodiments of the present invention have been described for illustrative purposes, those skilled in the art will appreciate that various modifications, additions and substitutions are possible, without departing from the scope and the spirit of the invention as disclosed in the accompanying claims.

What is claimed is:

1. A semiconductor chip comprising:
   a semiconductor substrate having one surface, an other surface which faces away from the one surface, and through holes which pass through the one surface and the other surface;
   through electrodes filled in the through holes;
   a gettering layer formed of polysilicon interposed between the through electrodes and inner surfaces of the semiconductor substrate whose form is defined by the through holes; and
   a dielectric layer formed between the gettering layer and the through electrodes.

2. The semiconductor chip according to claim 1, wherein the gettering layer is formed between entire inner surfaces of the semiconductor substrate whose form is defined by the through holes, and the through electrodes.

3. The semiconductor chip according to claim 1, further comprising:
   an adhesive layer formed between the dielectric layer and the through electrodes.

4. The semiconductor chip according to claim 1,
   wherein the semiconductor substrate further includes an integrated circuit which is formed from the one surface of the semiconductor substrate to a partial thickness of the semiconductor substrate, and
   wherein the gettering layer is formed between portions of the inner surfaces of the semiconductor substrate whose form is defined by the through holes where the integrated circuit is disposed, and the through electrodes.

5. The semiconductor chip according to claim 4,
   the dielectric layer is extended between the semiconductor substrate and the through electrodes for insulating the semiconductor substrate and the through electrodes.

6. The semiconductor chip according to claim 1, further comprising:
   a circuit pattern formed over the one surface of the semiconductor substrate, and including wiring layers and a dielectric layer which isolates the semiconductor substrate and the wiring layers from each other and isolates the wiring layers from one another,
   wherein the through electrodes pass through the circuit pattern.

7. The semiconductor chip according to claim 6, wherein the gettering layer extends to between the circuit pattern and the through electrodes such that the gettering layer is interposed between the circuit pattern and the through electrodes.

8. The semiconductor chip according to claim 1, further comprising:
   a circuit pattern formed over the one surface of the semiconductor substrate and the through electrodes,
   wherein the circuit pattern comprises:
   bonding pads formed over a second surface of the circuit pattern facing away from a first surface of the circuit pattern which faces the semiconductor substrate;
   wiring layers electrically connecting the through electrodes and the bonding pads with each other; and
   a dielectric layer isolating the semiconductor substrate and the through electrodes from the wiring layers, the wiring layers from one another, and the wiring layers and the bonding pads from each other.

9. A semiconductor package comprising:
   a plurality of semiconductor chips each including a semiconductor substrate having one surface, an other surface which faces away from the one surface, and through holes which pass through the one surface and the other surface, through electrodes filled in the through holes, and a gettering layer formed of polysilicon interposed between the through electrodes and inner surfaces of the semiconductor substrate whose form is by the through holes, the plurality of semiconductor chips being stacked such that their through electrodes are electrically connected with one another; and
   conductive connection members electrically connecting the through electrodes of the stacked semiconductor chips.

10. The semiconductor package according to claim 9, wherein the gettering layer is formed between entire inner surfaces of the semiconductor substrate whose form is defined by the through holes, and the through electrodes.

11. The semiconductor package according to claim 10, wherein each semiconductor chip further includes:
    a dielectric layer formed between the gettering layer and the through electrodes; and
    an adhesive layer formed between the dielectric layer and the through electrodes.

12. The semiconductor package according to claim 9,
    wherein the semiconductor substrate of each semiconductor chip further includes an integrated circuit which is formed from the one surface of the semiconductor substrate to a partial thickness of the semiconductor substrate, and
    wherein the gettering layer is formed between portions of the inner surfaces of the semiconductor substrate whose form is defined by the through holes where the integrated circuit is disposed, and the through electrodes.

13. The semiconductor package according to claim 12, wherein each semiconductor chip further includes:
    a dielectric layer formed between the gettering layer and the through electrodes and between the semiconductor substrate and the through electrodes; and
    an adhesive layer formed between the dielectric layer and the through electrodes.

14. The semiconductor package according to claim 9, wherein each semiconductor chip further includes:

a circuit pattern formed over the one surface of the semiconductor substrate, and including wiring layers and a dielectric layer which isolates the semiconductor substrate and the wiring layers from each other and the wiring layers from one another, and wherein the through electrodes pass through the circuit pattern.

15. The semiconductor package according to claim 14, wherein the gettering layer of each semiconductor chip extends to between the circuit pattern and the through electrodes such that the gettering layer is interposed between the circuit pattern and the through electrodes.

16. The semiconductor package according to claim 9, wherein each semiconductor chip further includes:
a circuit pattern formed over the one surface of the semiconductor substrate and the through electrodes, and
wherein the circuit pattern comprises:
bonding pads formed over a second surface of the circuit pattern facing away from a first surface of the circuit pattern which faces the semiconductor substrate;
wiring layers electrically connecting the through electrodes and the bonding pads with each other; and
a dielectric layer isolating the semiconductor substrate and the through electrodes from the wiring layers, the wiring layers from one another, and the wiring layers and the bonding pads from each other.

17. The semiconductor package according to claim 9, further comprising:
a first dielectric layer formed under a lower surface of a lowermost semiconductor chip among the stacked semiconductor chips in such a way as to leave exposed the through electrodes of the lowermost semiconductor chip;
redistribution lines formed under the first dielectric layer and electrically connected with the through electrodes exposed through the first dielectric layer; and
a second dielectric layer formed under the first dielectric layer including the redistribution lines in such a way as to leave exposed portions of the redistribution lines.

18. The semiconductor package according to claim 9, further comprising:
a structural body supporting the semiconductor chips and having connection electrodes which are electrically connected with the through electrodes of the lowermost semiconductor chip among the stacked semiconductor chips.

19. The semiconductor package according to claim 18, wherein the structural body comprises any one of a printed circuit board, an interposer and a semiconductor package.

* * * * *